United States Patent [19]

Reilly et al.

[11] Patent Number: 5,473,274
[45] Date of Patent: Dec. 5, 1995

[54] LOCAL CLOCK GENERATOR

[75] Inventors: Brian F. Reilly, Hillsboro; Clifford A. Davidow, Portland, both of Oreg.

[73] Assignee: NEC America, Inc., Melville, N.Y.

[21] Appl. No.: 944,504

[22] Filed: Sep. 14, 1992

[51] Int. Cl.⁶ .................................................. H03L 7/23
[52] U.S. Cl. ........................ 327/159; 327/155; 327/236
[58] Field of Search ...................... 328/63, 155; 307/269, 307/262; 331/11, 1 A; 327/159, 155, 236, 233

[56] References Cited

U.S. PATENT DOCUMENTS

| | | | |
|---|---|---|---|
| 3,646,452 | 2/1972 | Horowitz et al. | 328/63 |
| 4,069,462 | 1/1978 | Dunn | 331/11 |
| 4,272,729 | 6/1981 | Riley, Jr. | 331/11 |
| 4,357,707 | 11/1982 | Delury | 307/269 |
| 4,808,884 | 2/1989 | Hull et al. | 307/269 |
| 5,287,010 | 2/1994 | Hagiwara | 307/269 |

*Primary Examiner*—Andrew M. Dolinar
*Attorney, Agent, or Firm*—Lane, Aitken & McCann

[57] ABSTRACT

A local clock system uses a numerically controlled oscillator referenced to a stable oscillator to generate local clock signals under microprocessor control. Two feedback loops provide inputs to the microprocessor for maintaining synchronization with the external clock reference; a frequency locked and a phase-locked loop. The relatively wide-band frequency-locked loop is used to acquire initial synchronization with the external clock reference when the external clock is restored after having been lost or is switched to a new source. The phase-locked loop has a narrow bandwidth and provides a large attenuation of any jitter on the incoming reference with a resultant low output jitter. The microprocessor provides a hold-over operation upon loss of the external clock reference and when the external reference is restored it slowly adjusts the output clock frequency to match that of the reference, limiting the rate of adjustment so as not to exceed a specified allowable jitter in the local clock output.

7 Claims, 4 Drawing Sheets

LOCAL CLOCK GENERATOR

BACKGROUND OF THE INVENTION

1. Field of the Invention

The invention relates to a system for generating a local clock signal synchronized to an external reference clock, and more particularly, to an improved digital system that provides precise control of the local clock.

2. Description of the Prior Art

A number of systems, for example, the Synchronous Optical Network (SONET) prescribed by ANSI T1.105-1988, "Digital Hierarchy Optical Interface Rates and Formats Specifications", require a local clock generator that is precisely synchronized to an external reference clock source. For such applications, the system requires a local clock generator that continues to generate clock signals in the event of a loss of the reference clock source; a so-called clock hold-over mode of operation.

Various proposals have been made in the prior art for controlling a local reference clock source synchronized to an external reference clock. One commonly employed approach is to use a frequency responsive loop to establish initial synchronization between local clock and the external clock, and to use a phase-locked loop to maintain precise synchronization once initial synchronization has been established. While generally satisfactory, these prior art controllers are relatively complex in their implementation and many do not provide for stable clock operation in absence of the external reference clock. Further, in synchronizing the local clock to the external clock reference, prior art control systems may generate an excessive jitter in the local clock output either in response to a jitter in the reference clock, or in establishing synchronization after a lost clock reference. As will be appreciated by those skilled in the art, jitter refers to a displacement in time of a significant instant (e.g., a rising edge) in the actual clock signal from its ideal position in time.

SUMMARY OF THE INVENTION

One object of the invention is the provision of a local clock controller that provides a stable clock output in the event of loss of the external clock signal.

Another object of the invention is the provision of a local clock controller that limits the local clock jitter.

A still further object of this invention is the provision of a local clock system that is relatively simple in its design, and can be implemented with low-cost components.

Briefly, this invention contemplates the provision of a local clock system in which a numerically controlled oscillator referenced to a stable oscillator generates local clock signals under microprocessor control. Two feedback loops provide inputs to the microprocessor for maintaining synchronization with the external clock reference; a frequency locked and a phase-locked loop. The relatively wide-band frequency-locked loop is used to acquire initial synchronization with the external clock reference when the external clock is restored after having been lost or is switched to a new source. The phase-locked loop has a narrow bandwidth and provides a large attenuation of any jitter on the incoming reference with a resultant low output jitter. The microprocessor provides a hold-over operation upon loss of the external clock reference and when the external reference is restored it slowly adjusts the output clock frequency to match that of the reference, limiting the rate of adjustment so as not to exceed a specified allowable jitter in the local clock output.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
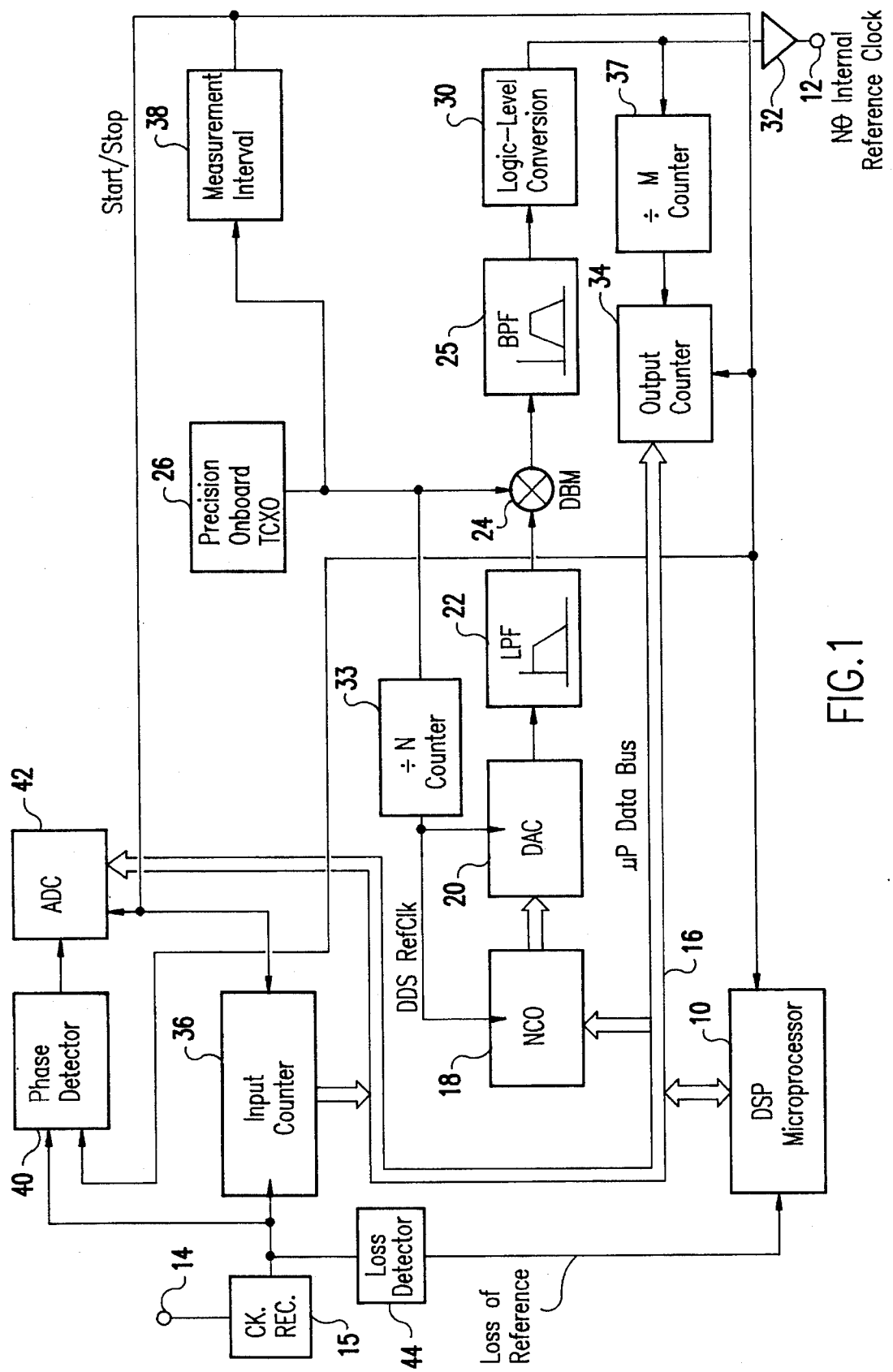
FIG. 1 is a block diagram on one embodiment of a local clock controller in accordance with the teachings of this invention.

Referring now to FIG. 1, a microprocessor 10 serves to lock the frequency and phase of a local output clock signal at terminal 12 to an external clock reference at terminal 14. A clock recovery circuit 15 converts the external reference clock signal, which is typically a bi-polar square wave of plus and minus 3 volts, to a digital logic signal. To achieve and maintain in a lock, microprocessor 10 generates a digital tuning word in response to a frequency or phase difference. As will be explained in greater detail, this tuning word adjusts the local clock signal frequency and phase. The microprocessor 10 is preferably of a type designed for digital signal processor applications, such as, for example, a Texas Instrument Corporation TMS-320 digital signal processor. Such processors are desirable for their ability to provide high-speed operation and fast numerical calculations.

A data buss 16 couples the output of microprocessor 10 to the input of a numerically controlled oscillator 18. The numerically controlled oscillator 18 generates a digitized sine wave output whose frequency and phase is determined by the digital tuning word written and maintained by the microcontroller 10 at the oscillator input. The resolution of the output frequency is a function of the frequency of the numerically controlled oscillator's internal clock divided by the length, in bits, of the tuning word. For example, a numerically controlled oscillator with a 21.5 MHz internal clock and a 32-bit tuning word has a resolution of 0.005 Hz.

A digital to analogue convertor 20 converts the output of the numerically controlled oscillator 18 to a stair-step approximation of a sine wave. A low pass filter 22 smooths the output of the convertor 20.

A double-balanced mixer 24 mixes the output of the convertor 20 with the output of a stable temperature compensated crystal oscillator 26 in order to generate a side band at the desired output frequency. A band-pass filter 28 selects an output at the desired sideband frequency. A logic level convertor 30 converts this analogue signal output to a logic level squarewave clock that is coupled to output terminal 12 via a buffer 32. The precision oscillator 26 is coupled to and serves also as a reference for establishing the base frequency of the numerically controlled oscillator 18. A divide by "N"

counter 33 couples the output of the precision clock oscillator 26 to the numerically controlled oscillator 18.

A counter 34 measures the frequency of the output clock at terminal 12, and counter 36 measures the frequency of the external clock reference at terminal 14. A timer 38 establishes an interval over which the input and output clocks are measured in making a comparison. The accumulated counts of counters 34 and 36, over the interval, are coupled as inputs to the microprocessor 10. If desired, a divide by "M" counter may be employed to adjust the input to counter 37.

Figure 2:
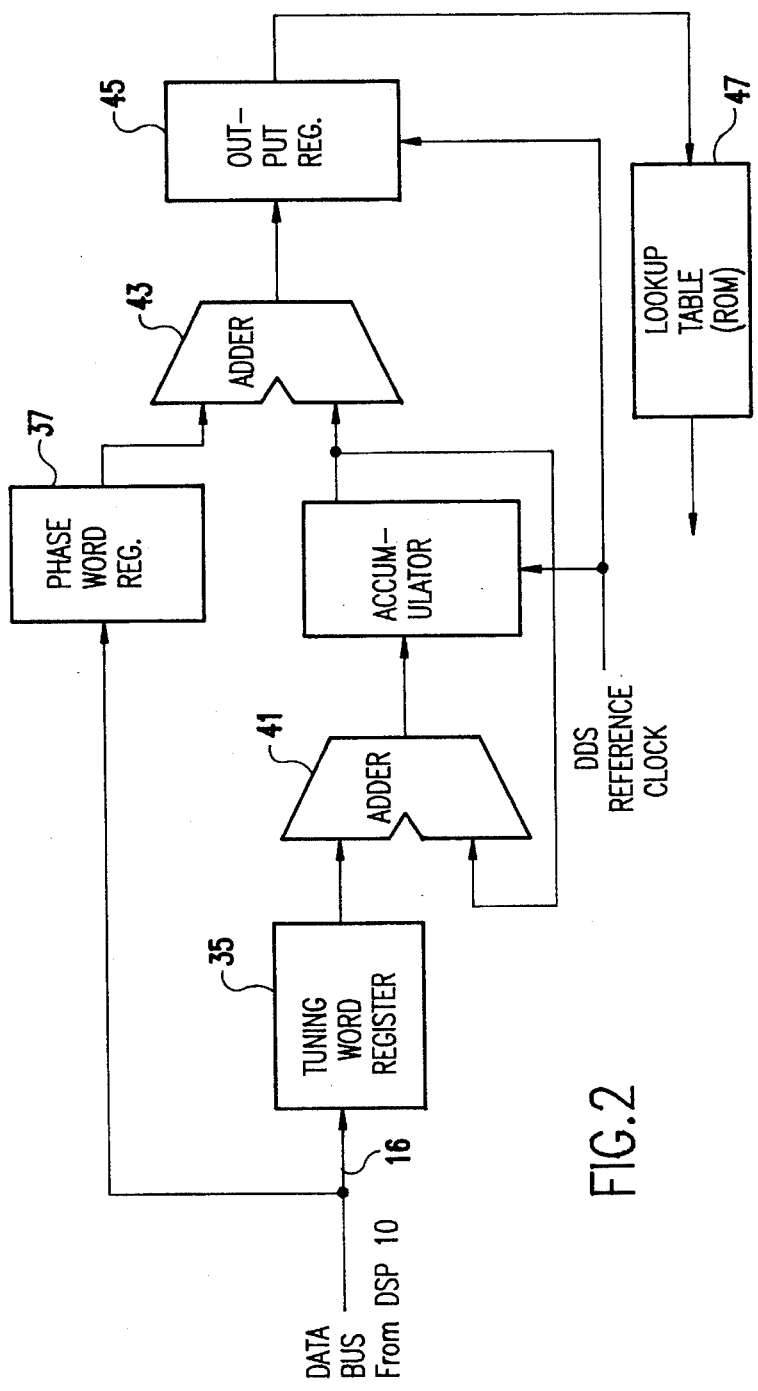
FIG. 2 is a block diagram showing additional details of the embodiment of the invention shown in FIG. 1.

The microprocessor 10 compares the accumulated counts of counters 34 and 36 at the end of each interval, and generates a digital tuning word to establish the frequency and phase of the output signal of numerically controlled oscillator 18 at a higher or lower value, depending upon the relative frequencies of the reference and output signals. Referring now to FIG. 2 in addition to FIG. 1, it shows in greater detail the numerically controlled oscillator 18. The NCO has two parametric controls: 1) the "tuning word", held in register 35, which establishes the frequency of operation, and 2) the "phase word", held in register 37, which allows the phase of the output to be instantaneously advanced or retarded without changing the frequency. The tuning word register 35 is coupled to an adder 41 where it is summed with the then existing frequency data word. Adder 43 sums the frequency and phase data; the sum is stored in output register 45 whose output is coupled to a look-up table 47. The output of table 47 is a digitized sign wave whose frequency and phase are selected by the tuning word and phase word, respectively.

The ability to change the phase without affecting the absolute frequency is useful in the phase-locked mode of operation. Instead of compensating for very small phase errors by raising or lowering the frequency. The output phase can be advanced or retarded.

If the accumulated count of counter 34 is greater than that of counter 36, the generated digital tuning word decreases the frequency of oscillator 18. If the accumulated count in counter 34 is less than that of counter 36, the digital tuning word increases output of the frequency of oscillator 18. This frequency lock operation establishes a frequency synchronization between the output clock and the incoming clock references and is relatively broad band in its operation. At the same time, each digital word generated in response to a difference in frequency is chosen so that the output frequency is changed in increments such that jitter in the output clock signal remains within system specifications. When frequency synchronization is established by adjusting the frequency of oscillator 18 so that the clock output frequency matches the input clock reference frequency, phase lock elements are used to obtain a precise narrow band lock and tracking of the output clock to the input clock reference.

To provide the phase lock, the clock output at terminal 12 and the external clock reference at terminal 14 are coupled as inputs to a phase detector 40. The output of phase detector 40 is an analogue signal whose magnitude is a function of the phase difference between its inputs. An analogue to digital convertor 42 converts the output of phase detector 40 to a digital signal that serves as an input to microprocessor 10. The microprocessor 10 generates a digital tuning word output in response to the input from convertor 42 to produce a fine adjustment in the frequency of numerically controlled oscillator 18 in order to establish and maintain a phase lock between the external reference clock and the output clock signal.

The microprocessor 10 functions as a narrow band filter to prevent jitter in the external reference from producing jitter in the external clock. The measured phase difference at ADC 42 becomes the input to a digital signal processing (DSP) algorithm executed by the microprocessor 10 for control of the frequency and phase of the output clock at terminal 12. The DSP algorithm is in essence a digital lowpass filter that smooths the jitter of the input reference at terminal 14. It outputs a dejittered reference value in the digital domain that is used to control the output reference clock.

If the external reference clock is lost, the system provides a hold-over mode of operation. In this mode of operation, the microprocessor 10 maintains the last tuning word prior to loss of the external clock reference and thus maintains constant the frequency of numerically controlled oscillator 18 at the value it had when the external reference clock was lost. A suitable detector 44 provides an input to microprocessor 10 indicating the loss of the external clock reference. Other means are also suitable of detecting a loss of the external reference. For example, a loss of count in counter 36, over a measuring interval, can also be used to signal a loss of the external clock signal.

Resumption of the external clock reference after it has been lost (or switching between external clock reference sources) creates a synchronization transient condition during which the system changes the local clock output to bring it into synchronization with the external source. To minimize jitter, the microprocessor 10 limits the incremental change in the output of the numerical controlled oscillator 28 per interval so that it does not exceed the system jitter specification. It will be appreciated that this can be accomplished at high clock rates with tight jitter specifications due to the fine resolution with which the frequency can be controlled.

Figure 3:
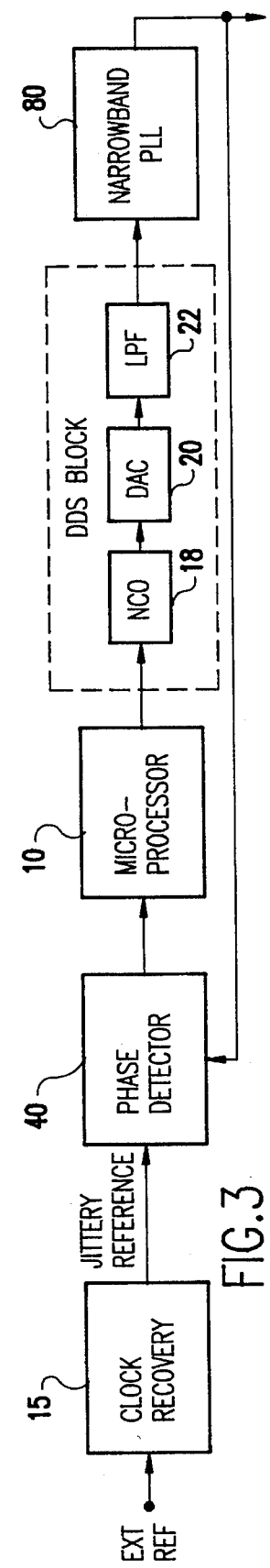
FIG. 3 is a block diagram of an alternative embodiment of the invention.

Referring now to FIG. 3, a somewhat simplified version of the invention eliminates the need for the double-balanced mixer 24 and the band-pass filter 28. Here a narrow band phase-lock loop 80 with a free-running frequency at the desired NE interval clock reference rate provides these functions.

Figure 4:
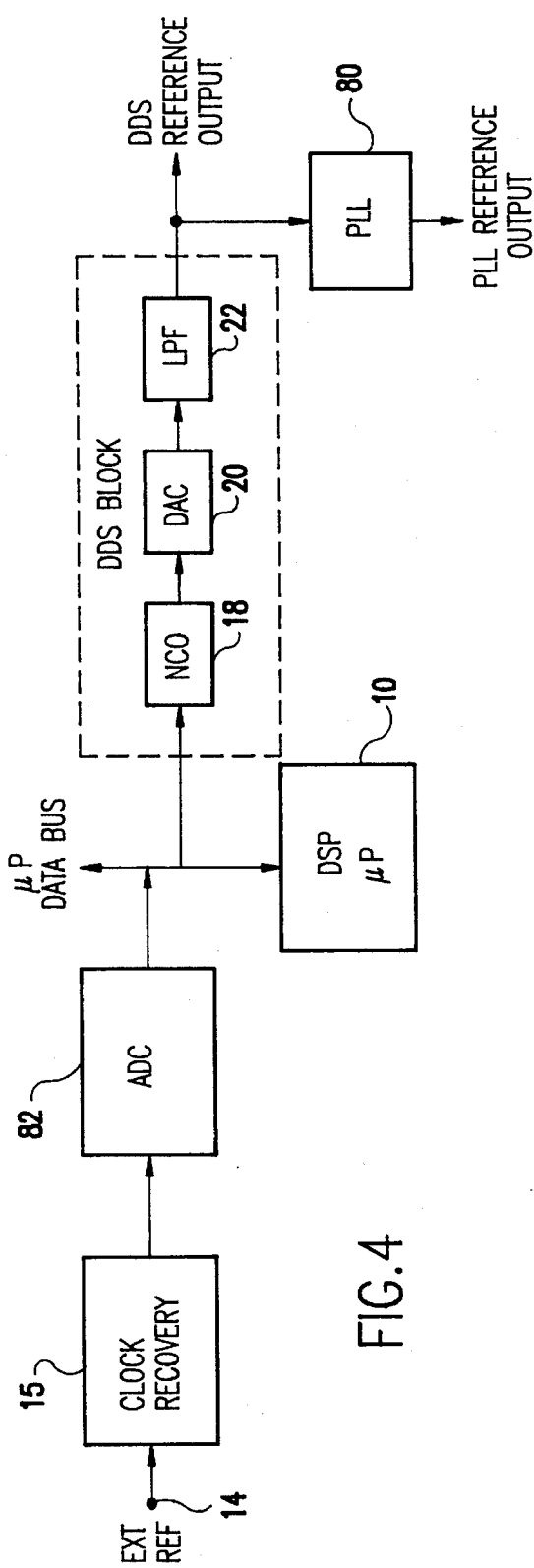
FIGS. 4 and 5 are block diagrams of yet other alternate embodiments of the invention.
Figure 5:
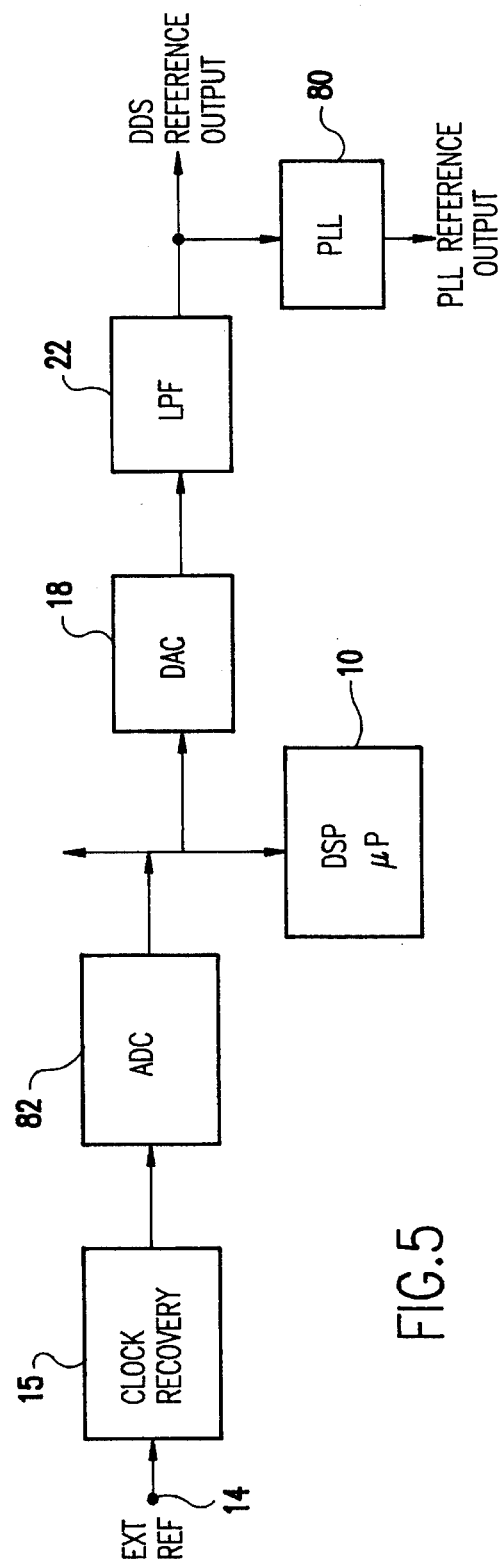

Referring now to FIG. 4, in this embodiment, an analogue-to-digital convertor 82 digitizes the external reference clock, and its output is coupled directly as an input to DPS microprocessor 10. Here, the DPS microprocessor 10 can be programmed to perform the functions of numerical phase detection, low-pass filtering of numerical phase detector, and holdover mode operation as well as miscellaneous housekeeping functions. The embodiment of course assumes an external reference signal frequency that is low enough to be digitized by the ADC 82. Further, if the output of the direct digital synthesizer (DDS) is sufficiently low in frequency relative to the instruction cycle time of DSP microprocessor 10, the microprocessor 10 can perform the function of numerically controlled oscillator 18 under program control, as illustrated in FIG. 5.

Figure 6:
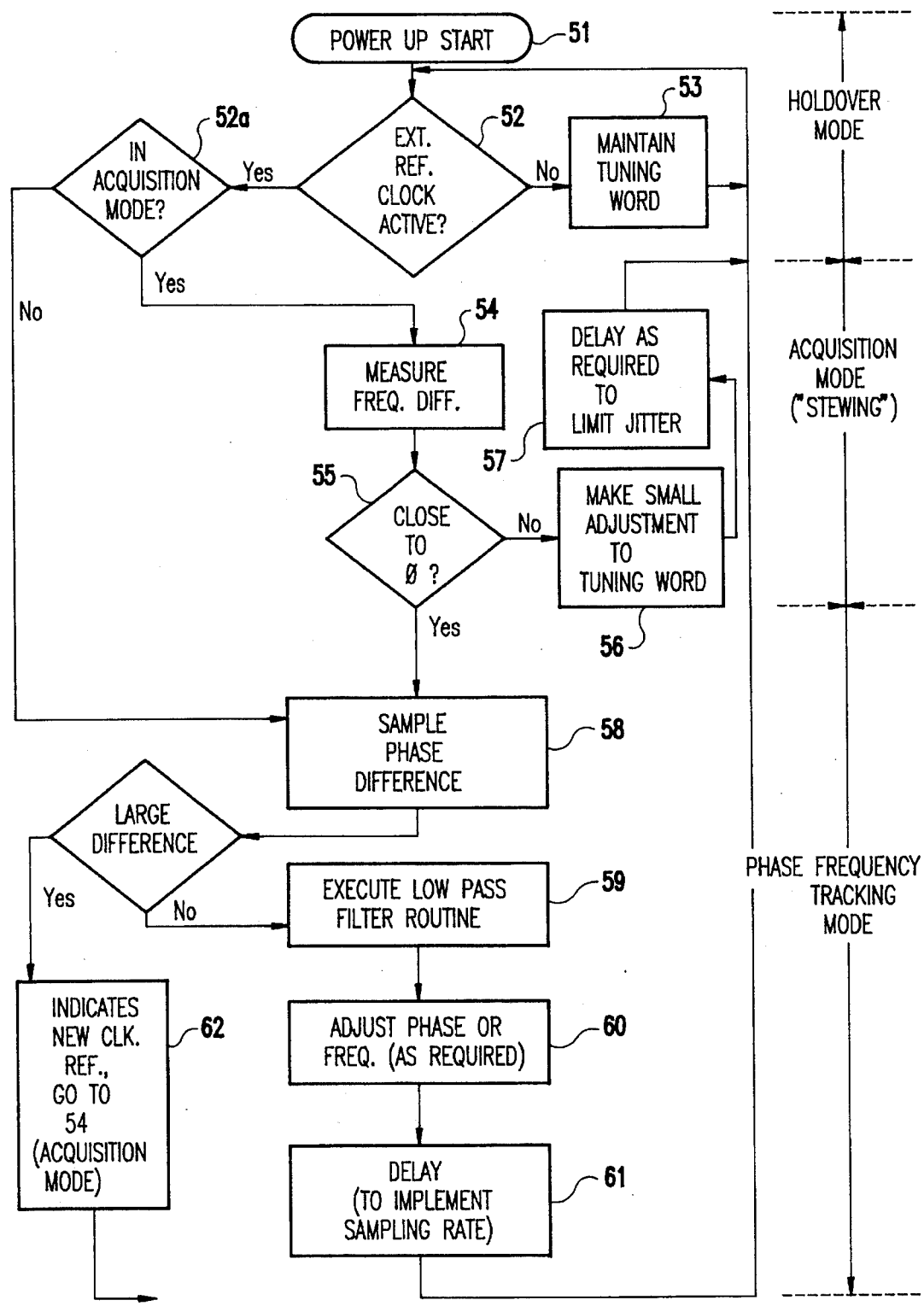
FIG. 6 is a flow diagram of an operational sequence of the microprocessor in accordance with the illustrative embodiment of the invention.

Referring now to FIG. 6, it illustrates the programmed operation of the microprocessor 10 that is repeated during each measurement interval established by interval counter 38. It shows holdover, acquisition and tracking modes. Note that algorithm always checks for presence/loss of reference, or a switch to a new reference of different frequency during tracking (which requires re-acquisition). A new reference is detected, for example, by a sudden jump in phase/frequency difference (at block 58a). The program starts at block 51 and detects the state of the external reference clock signal, block 52. If the external reference clock is not present, the program at block 53 maintains the digital tuning word established in the previous interval as the input to numerically controlled oscillator 18. This is a holdover mode of operation.

If the external clock reference signal is present, the program at decision block 52a determines whether the system is in an acquisition mode or a tracking mode of operation. In an acquisition mode, at block 54, the external clock and the local clock are compared. If the phase difference is large (block 55), the microprocessor makes a small adjustment in the tuning word (block 56) which adjustment may be implemented over a delay time period (block 57) in order to limit system jitter.

If the phase difference is small (see block 56) or the system is in a tracking mode (see block 52a), the phase difference is sampled (block 58). In decision block 58a the sampled phase difference is compared to a predetermined standard. If the difference is "large", a low pass filter routine is executed (block 59) and the phase or frequency of the local signal is adjusted (block 60) and delayed to accommodate the sampling rate (block 61).

If the difference is large (block 58a) this indicates a new clock reference and the program loops to block 54 as indicated at block 62.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A system for generating a local clock signal whose frequency and phase are synchronized to the frequency and phase of an external clock reference signal, comprising in combination;

a digitally controlled signal generator having an output signal whose frequency and phase are determined by a digital tuning word input to said digitally controlled signal generator;

microprocessor means for generating said digital tuning word, and means coupling a digital tuning word from said microprocessor to said digitally controlled signal generator to establish the frequency and phase of said output signal;

a frequency synchronizing loop, including said microprocessor means, for comparing said local clock signal and said external clock reference signal and generating a digital tuning word in response to a frequency difference between said local clock signal and said external clock reference signal frequency;

a phase synchronizing loop, including said microprocessor means, for comparing said local clock signal and said external clock reference signal and generating a digital tuning word in response to a phase difference between said local clock signal phase and said external clock reference signal phases;

a stable clock oscillator;

means to detect loss of said external clock reference signal; and means including said stable clock oscillator to maintain said local clock signal in the absence of said external clock reference.

2. A system for generating a local clock signal as in claim 1, wherein said digital tuning word generated in response to a phase difference alters said output signal of said digitally controlled signal generator independently of its frequency.

3. A system for generating a local clock signal whose frequency and phase are synchronized to the frequency and phase of an external clock reference signal, comprising in combination;

a digitally controlled signal generator including a numerically controlled oscillator, a digital-to-analogue convertor, and a low-pass filter and having an output signal whose frequency and phase are determined by a digital tuning word input to said digitally controlled signal generator;

microprocessor means for generating said digital tuning word, and means coupling a digital tuning word from said microprocessor to said digitally controlled signal generator to establish the frequency and phase of said output signal;

a frequency synchronizing loop, including said microprocessor means, for comparing said local clock signal and said external clock reference signal and generating a digital tuning word in response to a frequency difference between said local clock signal and said external clock reference signal frequency; and a phase synchronizing loop, including said microprocessor means, for comparing said local clock signal and said external clock reference signal and generating a digital tuning word in response to a phase difference between said local clock signal phase and said external clock reference signal phases.

4. A system for generating a local clock signal whose frequency and phase are synchronized to the frequency and phase of an external clock reference signal, comprising in combination;

a digitally controlled signal generator having an output signal whose frequency and phase are determined by a digital tuning word input to said digitally controlled signal generator;

microprocessor means for generating said digital tuning word, and means coupling a digital tuning word from said microprocessor to said digitally controlled signal generator to establish the frequency and phase of said output signal;

a frequency synchronizing loop, including said microprocessor means, for comparing said local clock signal and said external clock reference signal and generating a digital tuning word in response to a frequency difference between said local clock signal and said external clock reference signal frequency;

a phase synchronizing loop, including said microprocessor means, for comparing said local clock signal and said external clock reference signal and generating a digital tuning word in response to a phase difference between said local clock signal phase and said external clock reference signal phases;

said microprocessor modifying at least one of said digital tuning words if said digital tuning word would cause jitter in said local clock signal in excess of a predetermined amount;

a stable clock oscillator;

means to detect loss of said external clock reference signal; and means including said stable clock oscillator to maintain said local clock signal in the absence of said external clock reference;

5. A system for generating a local clock signal as in claim 4, wherein said digital tuning word generated in response to a phase difference alters said output signal of said digitally controlled signal generator independently of its frequency.

6. A system for generating a local clock signal as in claim 5, wherein said digitally controlled signal generator includes a numerically controlled oscillator, a digital-to-analogue convertor, and a low-pass filter.

7. A system for generating a local clock signal whose frequency and phase are synchronized to the frequency and phase of an external clock reference signal, comprising in combination;

a digitally controlled signal generator having an output signal whose frequency and phase are determined by a digital tuning word input to said digitally controlled signal generator;

microprocessor means for generating said digital tuning word, and means coupling a digital tuning word from said microprocessor to said digitally controlled signal generator to establish the frequency and phase of said output signal;

a frequency synchronizing loop, including said microprocessor means, for comprising said local clock signal and said external clock reference signal and generating a digital tuning word in response to a frequency difference between said local clock signal and said external clock reference signal frequency;

a phase synchronizing loop, including said microprocessor means, for comparing said local clock signal and said external clock reference signal and generating a digital tuning word in response to a phase difference between said local clock signal phase and said external clock reference signal phases;

said microprocessor modifying at least one of said digital tuning words if said digital tuning word would cause jitter in said local clock signal in excess of a predetermined amount; and said digitally controlled signal generator including a numerically controlled oscillator, a digital-to-analogue convertor, and a low-pass filter.

\* \* \* \* \*